(12) United States Patent
Matsui

(10) Patent No.: US 12,712,150 B2
(45) Date of Patent: Aug. 18, 2026

(54) ELECTRON BEAM MONITORING DEVICE AND ELECTRON BEAM IRRADIATION SYSTEM

(71) Applicant: HAMAMATSU PHOTONICS K.K., Hamamatsu (JP)

(72) Inventor: Shinjiro Matsui, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 321 days.

(21) Appl. No.: 18/698,476

(22) PCT Filed: Jun. 10, 2022

(86) PCT No.: PCT/JP2022/023485
§ 371 (c)(1),
(2) Date: Apr. 4, 2024

(87) PCT Pub. No.: WO2023/062871
PCT Pub. Date: Apr. 20, 2023

(65) Prior Publication Data
US 2024/0420918 A1 Dec. 19, 2024

(30) Foreign Application Priority Data
Oct. 15, 2021 (JP) ................................ 2021-169425

(51) Int. Cl.
*H01J 37/244* (2006.01)

(52) U.S. Cl.
CPC ..... *H01J 37/244* (2013.01); *H01J 2237/2445* (2013.01)

(58) Field of Classification Search
CPC ........................ H01J 37/244; H01J 2237/2445
See application file for complete search history.

(56) References Cited

U.S. PATENT DOCUMENTS 5,635,714 A 6/1997 Nablo et al.
6,713,773 B1 3/2004 Lyons et al.
(Continued)

FOREIGN PATENT DOCUMENTS

JP 2004-361195 A 12/2004
JP 2007-010533 A 1/2007
(Continued)

OTHER PUBLICATIONS

Extended European Search Report issued on Jul. 25, 2025 in corresponding European patent application 22880577.6.
(Continued)

*Primary Examiner* — Sean Luck
(74) *Attorney, Agent, or Firm* — Faegre Drinker Biddle & Reath LLP

(57) ABSTRACT

An electron beam monitoring device monitors an electron beam in an electron beam irradiation system having an electron beam irradiation device configured to irradiate an irradiation target object with the electron beam via an emission window. The electron beam monitoring device includes a first X-ray detection unit and a second X-ray detection unit. The first X-ray detection unit has a detection surface directed toward between the emission window and the irradiation target object and detects an X-ray. The second X-ray detection unit is arranged to face the emission window and detects a one-dimensional or two-dimensional distribution of the X-ray.

16 Claims, 10 Drawing Sheets

(56) References Cited

U.S. PATENT DOCUMENTS

| | | | | |
|---|---|---|---|---|
| 7,202,475 | B1 * | 4/2007 | Testoni | G01N 23/2252 250/307 |
| 8,314,386 | B2 * | 11/2012 | Zaluzec | H01J 37/26 250/306 |
| 2016/0307731 | A1 * | 10/2016 | Lock | B28B 17/00 |

FOREIGN PATENT DOCUMENTS

| | | | |
|---|---|---|---|
| JP | 4567652 | B2 | 10/2010 |
| JP | 2011-099839 | A | 5/2011 |
| JP | 2013-053924 | A | 3/2013 |
| JP | 6255415 | B2 | 12/2017 |
| JP | 6259598 | B2 | 1/2018 |
| JP | 6270471 | B2 | 1/2018 |
| WO | WO-2014/083054 | A1 | 6/2014 |

OTHER PUBLICATIONS

Kneeland D R et al, “Industrial use of the real time monitor for quality assurance in electron processing1”, Radiation Physics and Chemistry, Elsevier, Amsterdam, NL, vol. 55, No. 4, Jul. 11, 1999, p. 429-p. 436, XP004169518.

Kneeland D R et al, “Control of an electron processor with a real time dose rate monitor”, Radiation Physics and Chemistry, Elsevier, Amsterdam, NL, vol. 57, No. 3-6, Mar. 1, 2000, p. 675-p. 678, XP004192858.

Nablo Sam V et al, “Real time monitoring of electron processors”, Radiation Physics and Chemistry, vol. 46, No. 4, Sep. 12, 1995, p. 1377-p. 1383, XP028979043.

International Preliminary Report on Patentability mailed Apr. 25, 2024 for PCT/JP2022/023485.

* cited by examiner 1
55
82
33(30)
S
RA
81
75h
71
60
61
75
70
10
Y
Z

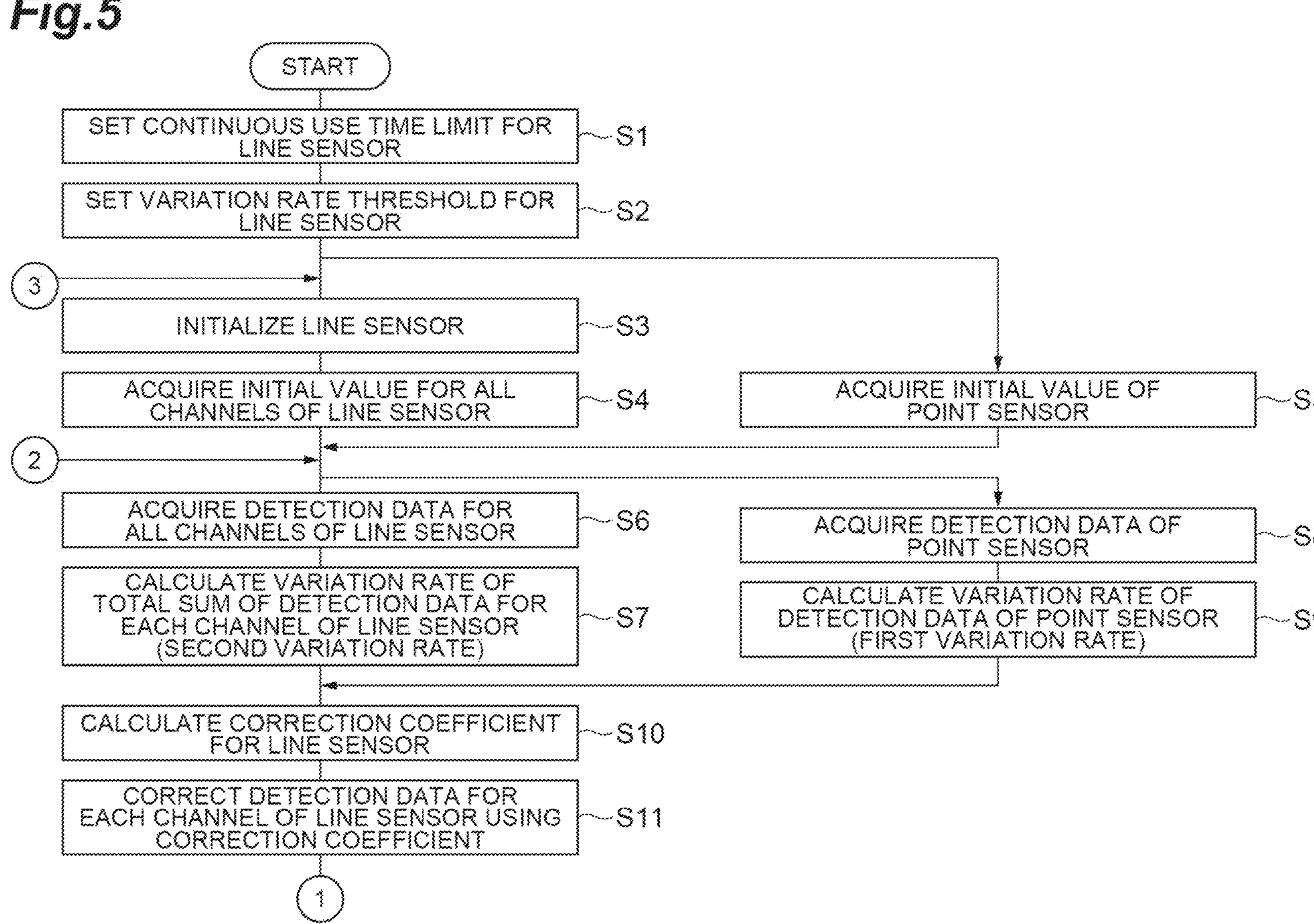
Fig.5
START
SET CONTINUOUS USE TIME LIMIT FOR LINE SENSOR
S1
SET VARIATION RATE THRESHOLD FOR LINE SENSOR
S2
3
INITIALIZE LINE SENSOR
S3
ACQUIRE INITIAL VALUE FOR ALL CHANNELS OF LINE SENSOR
S4
ACQUIRE INITIAL VALUE OF POINT SENSOR
S5
2
ACQUIRE DETECTION DATA FOR ALL CHANNELS OF LINE SENSOR
S6
ACQUIRE DETECTION DATA OF POINT SENSOR
S8
CALCULATE VARIATION RATE OF TOTAL SUM OF DETECTION DATA FOR EACH CHANNEL OF LINE SENSOR (SECOND VARIATION RATE)
S7
CALCULATE VARIATION RATE OF DETECTION DATA OF POINT SENSOR (FIRST VARIATION RATE)
S9
CALCULATE CORRECTION COEFFICIENT FOR LINE SENSOR
S10
CORRECT DETECTION DATA FOR EACH CHANNEL OF LINE SENSOR USING CORRECTION COEFFICIENT
S11
1

*Fig.7*

| | | CONTINUOUS USE TIME LIMIT | | | | | | CONTINUOUS USE TIME LIMIT | | | | | |
|---|---|---|---|---|---|---|---|---|---|---|---|---|---|
| CYCLE TIME | | 0 | 1 | 2 | 3 | 4 | 5 | 5 | 6 | 7 | 8 | 9 | 10 |
| DETECTION DATA OF POINT SENSOR | | 1 | 0.9990 | 0.9980 | 0.9970 | 0.9960 | 0.9950 | 0.9950 | 0.9940 | 0.9930 | 0.9920 | 0.9910 | 0.9900 |
| DETECTION DATA OF LINE SENSOR | CH1 | 1 | 0.990 | 0.980 | 0.970 | 0.960 | 0.950 | 0.9985 | 0.989 | 0.979 | 0.969 | 0.959 | 0.949 |
| | CH2 | 1 | 0.985 | 0.970 | 0.955 | 0.940 | 0.925 | 0.9722 | 0.957 | 0.942 | 0.927 | 0.912 | 0.897 |
| | CH3 | 1 | 0.993 | 0.986 | 0.979 | 0.972 | 0.965 | 1.0143 | 1.007 | 1.000 | 0.993 | 0.986 | 0.979 |
| VARIATION RATE OF LINE SENSOR | | 1 | 0.989 | 0.979 | 0.968 | 0.957 | 0.947 | 0.9950 | 0.984 | 0.974 | 0.963 | 0.952 | 0.942 |
| CORRECTION COEFFICIENT | | 1 | 1.010 | 1.020 | 1.030 | 1.040 | 1.051 | 1.000 | 1.010 | 1.020 | 1.030 | 1.041 | 1.051 |
| CORRECTED DETECTION DATA OF LINE SENSOR | CH1 | 1 | 0.9997 | 0.9994 | 0.9991 | 0.9988 | 0.9985 | 0.9985 | 0.9982 | 0.9979 | 0.9977 | 0.9974 | 0.9972 |
| | CH2 | 1 | 0.9946 | 0.9892 | 0.9836 | 0.9780 | 0.9722 | 0.9722 | 0.9666 | 0.9609 | 0.9551 | 0.9493 | 0.9433 |
| | CH3 | 1 | 1.0027 | 1.0055 | 1.0083 | 1.0113 | 1.0143 | 1.0143 | 1.0172 | 1.0201 | 1.0232 | 1.0263 | 1.0295 |

| CONTINUOUS USE TIME LIMIT | | | | | | | |
|---|---|---|---|---|---|---|---|
| 10 | 11 | 12 | 13 | 14 | 15 | 15 | 16 |
| 0.9900 | 0.9890 | 0.9880 | 0.9870 | 0.9860 | 0.9850 | 0.9850 | 0.9845 |
| 0.9972 | 0.987 | 0.977 | 0.967 | 0.957 | 0.947 | 0.9961 | 0.986 |
| 0.9433 | 0.928 | 0.913 | 0.898 | 0.883 | 0.868 | 0.9131 | 0.898 |
| 1.0295 | 1.023 | 1.016 | 1.009 | 1.002 | 0.995 | 1.0459 | 1.039 |
| 0.9900 | 0.979 | 0.969 | 0.958 | 0.947 | 0.937 | 0.9850 | 0.974 |
| 1.000 | 1.010 | 1.020 | 1.030 | 1.041 | 1.052 | 1.000 | 1.010 |
| 0.9972 | 0.9969 | 0.9967 | 0.9965 | 0.9963 | 0.9961 | 0.9961 | 0.9963 |
| 0.9433 | 0.9374 | 0.9315 | 0.9255 | 0.9193 | 0.9131 | 0.9131 | 0.9074 |
| 1.0295 | 1.0326 | 1.0358 | 1.0391 | 1.0424 | 1.0459 | 1.0459 | 1.0496 |

1
55
82
33(30)
S
RA
81
75h
71
75h
75h
75h
60
61
111
75
70
110
Y
Z 1
220
55
260
265
RA
X
Y
Z
270h
251
211
270

270
270h
250h
251
210m
211
X
Y
Z

ELECTRON BEAM MONITORING DEVICE AND ELECTRON BEAM IRRADIATION SYSTEM

TECHNICAL FIELD

The present disclosure relates to an electron beam monitoring device and an electron beam irradiation system.

BACKGROUND ART

As an electron beam irradiation system, for example, Patent Literature 1 discloses a system provided with an electron beam irradiation device that irradiates an irradiation target object with an electron beam via an emission window (or a part that extracts electron beams). This electron beam irradiation device includes an X-ray detector provided on the side wall of a vacuum vessel (or a scan horn) of the device for the purpose of measuring electron beams guided to the outside from inside the vacuum vessel.

CITATION LIST

Patent Literature

Patent Literature 1: Japanese Unexamined Patent Publication No. 2013-053924

SUMMARY OF INVENTION

Technical Problem

In the electron beam irradiation system described above, fluctuations in the radiation dose and distribution of the electron beam applied to the irradiation target object are likely to occur, for example, stemming from factors such as the occurrence of micro-discharge and fluctuations in the transmittance of the emission window. For this reason, for example, in the case where an electron beam irradiation system is used for curing ink in printing, problems such as a part of the ink not being cured are liable to occur. Thus, it is advisable for the electron beam irradiation system described above to monitor the dose and distribution of the electron beam applied to the irradiation target object (i.e., real-time detection of the dose and distribution of the electron beam being applied to the irradiation target object).

The present disclosure has been made in view of the circumstances mentioned above, with the intention of providing an electron beam monitoring device and electron beam irradiation system capable of monitoring the dose and distribution of the electron beam applied to an irradiation target object.

Solution to Problem

An electron beam monitoring device according to one aspect of the present disclosure monitors an electron beam in an electron beam irradiation system having an electron beam irradiation device configured to irradiate an irradiation target object with the electron beam via an emission window. The electron beam monitoring device includes a first X-ray detection unit having a detection surface directed toward between the emission window and the irradiation target object and configured to detect an X-ray, and a second X-ray detection unit arranged to face the emission window and configured to detect a one-dimensional or two-dimensional distribution of the X-ray.

The electron beam applied to the irradiation target object via the emission window, for example, repeatedly collides with gaseous molecules in the irradiation atmosphere between the emission window and the irradiation target object, resulting in X-ray generation by the collision. In other words, there is a close relationship between the electron beam applied to the irradiation target object via the emission window and the X-rays generated by the irradiation with the electron beam. Thus, it has been discovered that monitoring the X-rays makes it possible to monitor the electron beam applied to the irradiation target object. In this regard, the electron beam monitoring device according to one aspect of the present disclosure makes it possible to use the first X-ray detection unit to monitor the dose of X-rays generated by the electron beam applied to the irradiation target object. Additionally, the electron beam monitoring device makes it possible to use the second X-ray detection unit to monitor the dose and distribution of X-rays generated by the electron beam applied to the irradiation target object. Consequently, it becomes possible to monitor both the dose and distribution of the electron beam applied to the irradiation target object.

In the electron beam monitoring device according to one aspect of the present disclosure, the emission window may have an elongated shape, and the first X-ray detection unit may be arranged in a position spaced apart from the emission window in the longitudinal direction of the emission window. This arrangement of the first X-ray detection unit is effective in monitoring the overall dose of the generated X-ray with the first X-ray detection unit in the case where the emission window has an elongated shape.

In the electron beam monitoring device according to one aspect of the present disclosure, the first X-ray detection unit may include only one first X-ray detector having only one channel for detecting the X-ray. In this case, using the first X-ray detector with only one channel for detecting the X-ray makes it possible to easily monitor the overall dose of the generated X-ray without performing complicated signal processing.

In the electron beam monitoring device according to one aspect of the present disclosure, the first X-ray detection unit includes multiple first X-ray detectors, each having only one channel for detecting the X-ray. Furthermore, among the multiple first X-ray detectors, a pair of the first X-ray detectors may be arranged to face each other across an electron beam-reaching range, which is a scope reached by the electron beam applied from the electron beam irradiation device. In this case, using the multiple first X-ray detectors having only one channel for detecting the X-ray makes it possible to monitor the overall dose of generated X-ray more accurately.

In the electron beam monitoring device according to one aspect of the present disclosure, the second X-ray detection unit may have a detection surface with an elongated shape. In this case, using the second X-ray detection unit having the detection surface with an elongated shape makes it possible to monitor the distribution of the X-ray in the longitudinal direction of the emission window.

In the electron beam monitoring device according to one aspect of the present disclosure, the second X-ray detection unit may include a second X-ray detector having multiple channels for detecting the X-ray, and the multiple channels may be arranged in a one-dimensional or two-dimensional form. In this case, using the second X-ray detector having multiple channels arranged in a one-dimensional or two-dimensional form makes it possible to monitor the distribution of the X-ray in more detail.

In the electron beam monitoring device according to one aspect of the present disclosure, the second X-ray detection unit may include multiple second X-ray detectors, each having only one channel for detecting the X-ray, and the multiple second X-ray detectors may be arranged in a one-dimensional or two-dimensional form. In this case, using the multiple second X-ray detectors arranged in a one-dimensional or two-dimensional form makes it possible to monitor the distribution of the X-ray in more detail.

The electron beam monitoring device according to one aspect of the present disclosure may include a collimator positioned between the emission window and the second X-ray detection unit and configured to restrict the traveling direction of the X-ray to align with a direction facing the emission window. In this case, aligning the traveling direction of the X-ray incident on the second X-ray detection unit to the direction facing the emission window makes it possible to detect the one-dimensional or two-dimensional distribution of the X-ray with higher precision by the second X-ray detection unit.

The electron beam monitoring device according to one aspect of the present disclosure may include a blocking unit capable of blocking an X-ray incident on the second X-ray detection unit. In this case, the blocking unit is capable of blocking the X-ray so that the X-ray is not incident on the second X-ray detection unit, for example, except during detection. This makes it possible to suppress fluctuations in the sensitivity of the second X-ray detection unit as the time to irradiate the second X-ray detection unit with the X-ray increases.

In the electron beam monitoring device according to one aspect of the present disclosure, the first X-ray detection unit and the second X-ray detection unit may be arranged in a position to avoid interference with irradiation of the irradiation target object with the electron beam. Furthermore, the first X-ray detection unit and the second X-ray detection unit may be arranged outside the electron beam-reaching range, which is the scope reached by the electron beam applied from the electron beam irradiation device. In this case, it is possible to arrange the first X-ray detection unit and the second X-ray detection unit in a position to avoid interference with the irradiation of the irradiation target object with the electron beam.

The electron beam monitoring device according to one aspect of the present disclosure may include a correction unit configured to correct a result obtained from detection by the second X-ray detection unit on the basis of a result obtained from detection by the first X-ray detection unit. This makes it possible to correct the detection result of the second X-ray detection unit on the basis of the detection result of the first X-ray detection unit, thereby suppressing the adverse effects of sensitivity fluctuations in the second X-ray detection unit. Thus, this configuration makes it possible to detect the one-dimensional or two-dimensional distribution of the X-ray with higher precision and to monitor the distribution of the electron beam applied to the irradiation target object with higher precision.

In the electron beam monitoring device according to one aspect of the present disclosure, the first X-ray detection unit may acquire detection data over time. The second X-ray detection unit may acquire detection data over time in the multiple channels. The correction unit may calculate a variation rate of the detection data acquired by the first X-ray detection unit as a first variation rate, calculate a variation rate of a total sum or an average of multiple pieces of detection data acquired by the second X-ray detection unit as a second variation rate, and multiply a correction coefficient to each of the detection data acquired in the multiple channels of the second X-ray detection unit in such a way as to make the second variation rate match the first variation rate. In this case, it is possible to correct the detection result of the second X-ray detection unit effectively.

In the electron beam monitoring device according to one aspect of the present disclosure, the electron beam irradiation system may include a conveyance mechanism provided with a conveyance surface for transporting the irradiation target object. The first X-ray detection unit may be arranged in a position spaced apart from the conveyance surface in a predetermined direction that is along the conveyance surface and intersects with a conveyance direction of the conveyance mechanism. The second X-ray detection unit may be arranged on a side opposite to the emission window with respect to the conveyance surface. In this case, it is possible to arrange the first X-ray detection unit and the second X-ray detection unit in a position that avoids affecting the conveyance in the electron beam irradiation system having the conveyance mechanism.

The electron beam irradiation system according to one aspect of the present disclosure includes the electron beam monitoring device described above. The electron beam monitoring device included in the electron beam irradiation system enables the dose and distribution of the electron beam applied to the irradiation target object to be monitored.

Advantageous Effects of Invention

According to the present disclosure, it is possible to provide an electron beam monitoring device and electron beam irradiation system capable of monitoring the dose and distribution of the electron beam applied to an irradiation target object.

BRIEF DESCRIPTION OF DRAWINGS

FIG. 5 is a flowchart illustrating an example of an electron beam monitoring method using the electron beam monitoring device of FIG. 3.

FIG. 7 is a table illustrating an example of the correction of detection data by a line sensor based on detection data by the point sensor.

DESCRIPTION OF EMBODIMENTS

Figure 1:
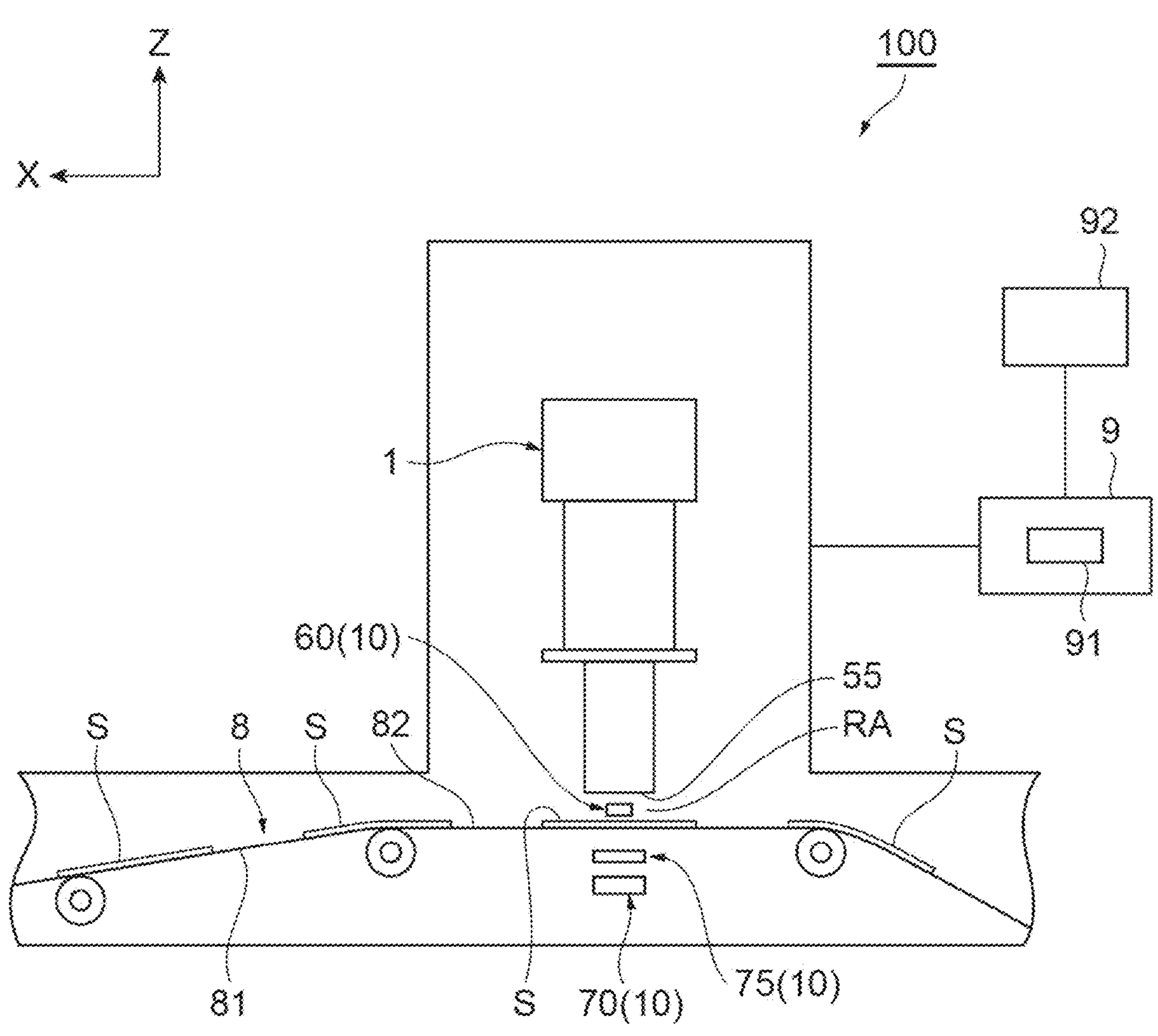
FIG. 1 is a perspective view illustrating an electron beam irradiation system according to an embodiment.

Embodiments are now described in detail with reference to the drawings. The following description will use the same reference numerals for the same or equivalent elements, and repeated descriptions will be omitted.

Figure 2:
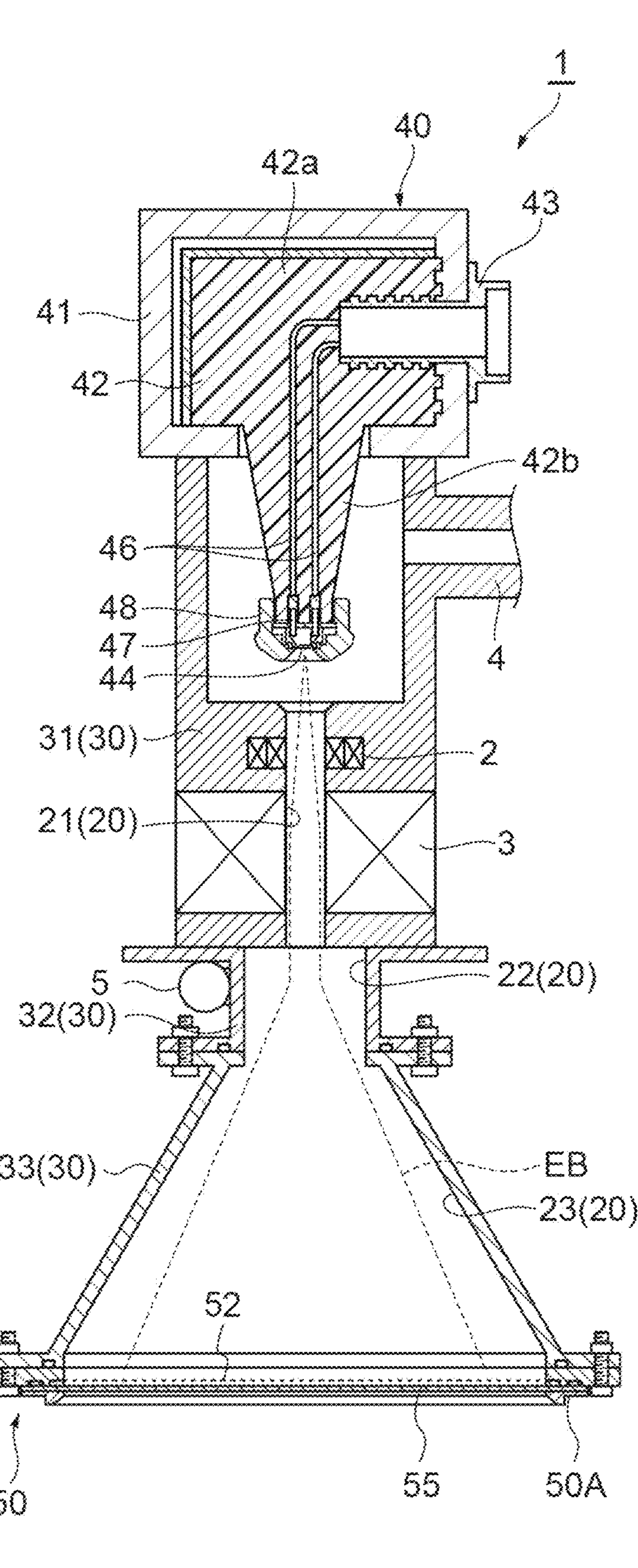
FIG. 2 is a longitudinal cross-sectional view illustrating an electron beam irradiation device of FIG. 1.

FIG. 1 is a perspective view illustrating an electron beam irradiation system 100. FIG. 2 is a longitudinal cross-sectional view illustrating an electron beam irradiation device 1. The X, Y, and Z directions are based on the illustrated directions for convenience. In this example, the X direction corresponds to the horizontal direction, the Y direction corresponds to the horizontal direction perpendicular to the X direction, and the Z direction corresponds to the vertical direction.

As illustrated in FIG. 1, the electron beam irradiation system 100 is a system used for sterilization, drying, surface modification, or similar processes on an irradiation target object S by directing an electron beam on the irradiation target object S. In one example, the irradiation target object S is a printed matter, and the electron beam irradiation system 100 is used for drying ink on the printed matter. Moreover, the irradiation target object S is not limited to a particular type and may be various objects. In addition, irradiation of the electron beam to the irradiation target object S is not limited to the entire irradiation target object S and may be applied to a part of the irradiation target object S. The electron beam irradiation system 100 includes the electron beam irradiation device 1, a conveyance mechanism 8, and a controller 9.

As illustrated in FIG. 2, the electron beam irradiation device 1 includes a chamber 30, an electron gun 40, and an electron beam transmission unit 50. The chamber 30 forms an electron beam passage hole 20. The electron gun 40 is airtightly attached to the chamber 30 in such a way as to close one end of the electron beam passage hole 20 in the Z direction. The electron beam transmission unit 50 is airtightly attached to the chamber 30 in such a way as to close the other end of the electron beam passage hole 20 in the Z direction. An electron beam EB generated by the electron gun 40 travels through the electron beam passage hole 20 along the Z direction and is emitted to the outside via an emission window 55 of the electron beam transmission unit 50.

The chamber 30 has a housing 31 to which the electron gun 40 that generates an electron beam is attached. The housing 31 is formed in a cylindrical shape with metal. The electron gun 40 has a case 41 formed in a rectangular shape with metal. The case 41 is airtightly fixed to the housing 31. The case 41 has an insulating block 42 made of an insulating material (e.g., such as epoxy resin) arranged therein. The insulating block 42 includes a base 42*a* housed in the case 41 and a protrusion 42*b* protruding from the base 42*a* in the Z direction. The insulating block 42 embeds the distal end of a connector 43.

The connector 43 supplies a filament 44, which is the cathode, with high voltage from an external power supply device. The connector 43 has a base end portion protruding outside the case 41. The distal end of the connector 43 is connected to a pair of internal wires 46 and 46. The pair of internal wires 46 and 46 extend to the front end of the protrusion 42*b* and are connected to a pair of power supply pins 47 and 47, respectively. The filament 44 is spanned across the distal ends of the pair of power supply pins 47 and 47. The protrusion 42*b* has a grid electrode 48 fixed around it, encompassing the power supply pins 47 and the filament 44.

The housing 31 is provided with an alignment coil 2 and a focusing coil 3 in such a way as to form a pair with an electron beam passage hole 21 in between. The electron beam EB emitted from the electron gun 40 passes through the electron beam passage hole 21. The alignment coil 2 adjusts the centerline of the electron beam EB to coincide with the centerline of the electron beam passage hole 20. Then, the focusing coil 3 focuses the electron beam EB onto the electron beam transmission unit 50. Moreover, the housing 31 is provided with an exhaust pipe 4, which connects the electron beam passage hole 21 and a vacuum pump, allowing the inside of the chamber 30 (i.e., the electron beam passage hole 20) to be evacuated.

The chamber 30 has a deflection tube 32 fixed to the other end of the housing 31 in the Z direction. The deflection tube 32 has a square columnar outer shape. An electron beam passage hole 22, which is the portion of the electron beam passage hole 20 formed by the deflection tube 32, has a rectangular cross-section with the longitudinal direction being the Y-axis direction. A deflection coil 5 is attached to the outside of the deflection tube 32 to deflect the electron beam EB passing inside the deflection tube 32. The electron beam EB, which is focused by the focusing coil 3 and passes through the electron beam passage hole 22, is deflected in the Y-axis direction by the deflection coil 5.

The chamber 30 has a scanning tube 33 fixed to the other end of the deflection tube 32 in the Z direction. The scanning tube 33 has a flared quadrangular columnar outer shape that widens toward the other end in the Z direction. The electron beam passage hole 23, which is the portion of the electron beam passage hole 20 formed by the scanning tube 33, has a rectangular cross-section with the longitudinal direction being the Y-axis direction.

The electron beam transmission unit 50 is arranged at the exit side opening of the scanning tube 33. The electron beam transmission unit 50 is airtightly fixed to the scanning tube 33. The electron beam transmission unit 50 includes a window frame body 50A. The window frame body 50A includes a support member 52 and the emission window 55, both of which are arranged therein and have a rectangular shape (elongated shape) with the longitudinal direction being in the Y-axis direction. The support member 52 includes a mesh portion. The emission window 55 is a thin film-like member made of titanium. The emission window 55 is arranged to cover the support member 52. The emission window 55 is supported on the support member 52 and transmits the electron beam EB passing through the inside of the scanning tube 33.

In the electron beam irradiation device 1 configured as described above, applying a high voltage to the filament 44 causes electrons to be emitted from the filament 44. The electrons emitted from the filament 44 are accelerated and focused through the electric field formed by the grid electrode 48, so that the electron beam EB is emitted in the Z-axis direction. The electron beam EB that is emitted and passes through the electron beam passage hole 21 is adjusted by the alignment coil 2 in such a way that the center line of the electron beam EB coincides with the center line of the electron beam passage hole 20, and then focused on the electron beam transmission unit 50 by the focusing coil 3. The electron beam EB, which is focused by the focusing coil 3 and passes through the electron beam passage hole 22, is deflected in the Y-axis direction by the deflection coil 5. The electron beam EB deflected in the Y-axis direction by the deflection coil 5 passes via the emission window 55 of the electron beam transmission unit 50 and is emitted to the outside. The electron beam EB emitted to the outside is applied to the irradiation target object S transported by the conveyance mechanism 8 (see FIG. 1) in an electron beam-reaching range RA, and the irradiation target object S undergoes reactions (such as drying, sterilization, and surface modification). The electron beam-reaching range RA is a scope that the electron beam EB irradiated from the electron beam irradiation device 1 reaches.

As illustrated in FIG. 1, the conveyance mechanism 8 has a movable belt 81. The conveyance mechanism 8 has a conveyance surface 82 on which the irradiation target object S is transported. The conveyance surface 82 is configured by, for example, the surface of the movable belt 81. The conveyance mechanism 8 is used to place the irradiation target object S on the conveyance surface 82 for transportation. The conveyance surface 82 faces the emission window 55. In the illustrated example, the conveyance mechanism 8 transports the irradiation target object S on the conveyance surface 82 to ensure that the irradiation target object S passes through the electron beam-reaching range RA along the X direction. The conveyance mechanism 8 is not limited to a particular device, and various mechanisms may be used.

The controller 9 is a computer composed of a central processing unit (CPU), read-only memory (ROM), random-access memory (RAM), and similar components. Various operations in the controller 9 are controlled by, for example, a program stored in the ROM being loaded onto the RAM and executed by the CPU. The controller 9 may be configured as hardware such as an electronic circuit. The controller 9 controls various operations of the electron beam irradiation system 100.

Figure 3:
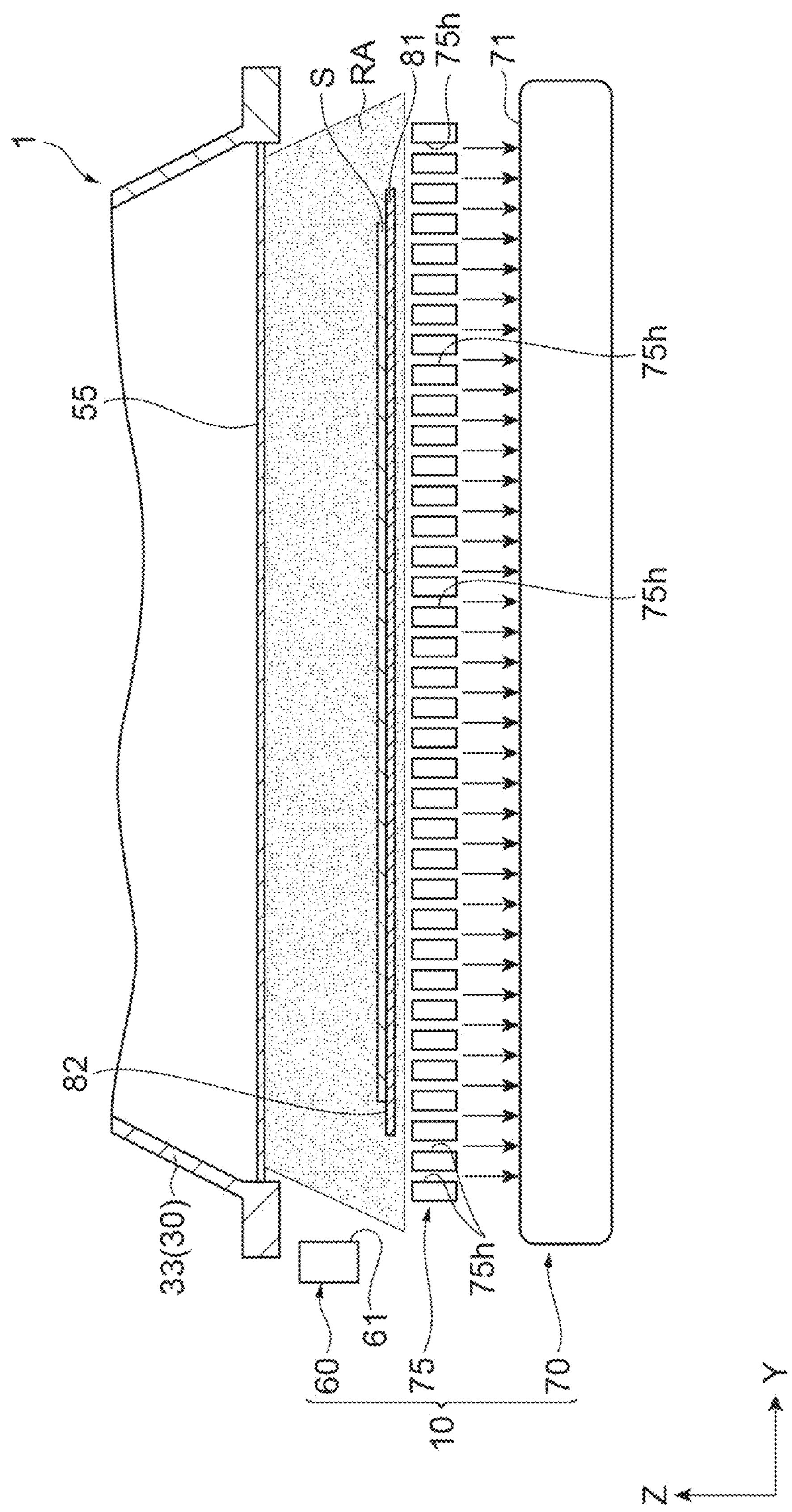
FIG. 3 is a schematic diagram illustrating an electron beam monitoring device of FIG. 1.

FIG. 3 is a schematic diagram illustrating an electron beam monitoring device 10. As illustrated in FIGS. 1 and 3, the electron beam irradiation system 100 according to the present embodiment includes the electron beam monitoring device 10 that monitors the electron beam EB applied to the irradiation target object S. The monitoring includes real-time detection of the electron beam EB while the irradiation target object S is being irradiated with the electron beam EB. The monitoring is herein also used to mean observing and checking. The electron beam monitoring device 10 does not monitor the electron beam EB itself that is applied to the irradiation target object S but monitors the electron beam EB by monitoring X-rays generated by the application of the electron beam EB. The reason why the electron beam monitoring device 10 performs monitoring using X-rays is now described.

The electron beam EB emitted from the electron beam irradiation device 1 into the irradiation atmosphere (e.g., a nitrogen atmosphere) via the emission window 55 undergoes energy attenuation while repeatedly colliding with gaseous molecules in the irradiation atmosphere. Due to this process, the reach distance that the electron beam EB is very short, and in particular, for a low-energy electron beam with an acceleration voltage of approximately 70 kV to 150 kV, which is used for applications such as printing, the electron beam EB only reaches a few millimeters to several tens of millimeters from the emission window 55. The electron beam-reaching range RA is also limited to a few millimeters to several tens of millimeters from the emission window 55. Thus, it is necessary for the direct monitoring of the electron beam EB to install an electron beam detector within this narrow electron beam-reaching range RA. However, the transport path of the conveyance mechanism 8 is provided to pass through the electron beam-reaching range RA, making it difficult to install an electron beam detector in the electron beam irradiation system 100.

On the other hand, in the case where the electron beam EB is emitted into the irradiation atmosphere, X-rays are also generated at the same time. X-rays are generated, for example, through the collision between the electron beam EB and the emission window 55 of the electron beam irradiation device 1 and the collision between the electron beam EB and gaseous molecules in the irradiation atmosphere. In other words, the amount of the electron beam EB applied to the irradiation target object S via the emission window 55 is closely related to the amount of X-rays generated as a result of the irradiation with the electron beam EB. These X-rays have energies ranging from several keV to several hundred keV, so they can reach even at a distance of several tens of centimeters or more in an irradiation atmosphere. Thus, in the case of monitoring the X-rays during the emission of the electron beam EB, an X-ray detector does not need to be installed within the electron beam-reaching range RA, and it can be at a distance of installed several tens of centimeters away. Thus, the X-ray detector is installable at a peripheral position that does not interfere with the conveyance mechanism 8 and the irradiation target object S, making it possible to achieve real-time detection of the X-rays while the electron beam irradiation system 100 is actually operated.

The electron beam monitoring device 10 using such an X-ray monitoring includes a point sensor 60, a line sensor 70, and a collimator 75. The point sensor 60 is an X-ray detector that detects X-rays (a first X-ray detector). The point sensor 60 herein is a sensor with high radiation durability, capable of stably measuring the X-ray dose over a long period of time. The point sensor 60 has a detection surface 61 directed toward between the emission window 55 and the irradiation target object S. The detection surface 61 is provided to face the space between the emission window 55 and the irradiation target object S, with the irradiation target object S being at a position facing the emission window 55 (i.e., directly below the emission window 55 or within the electron beam-reaching range RA). The detection surface 61 is provided perpendicular to the Y direction.

The point sensor 60 is placed at a position where it does not interfere with the irradiation of the irradiation target object S with the electron beam EB. In the present embodiment, the point sensor 60 is placed outside the electron beam-reaching range RA. The point sensor 60 is arranged in a position spaced apart from the emission window 55 and the conveyance surface 82 in the Y direction. The Y direction corresponds to the longitudinal direction of the emission window 55. In addition, the Y direction corresponds to a predetermined direction that is along the conveyance surface 82 and intersects with a conveyance direction. The point sensor 60 is arranged on the side of the emission window 55 and the conveyance surface 82. The point sensor 60 is arranged around the emission window 55 and the conveyance surface 82. The point sensor 60 is fixed to the frame or the like of the electron beam irradiation system 100, for example, by a support member (not illustrated).

The point sensor 60 is an X-ray detector that has only one channel for detecting X-rays. More specifically, the point sensor 60 has only one detection element having only one detection signal output unit corresponding to one detection surface. In other words, the point sensor 60 is a sensor having only one pixel. The point sensor 60 acquires detection data regarding the X-ray dose over time in one channel (pixel). The point sensor 60 is connected to the controller 9 that controls operations of the point sensor 60. The point sensor 60 outputs the result obtained from its detection to the controller 9. The point sensor 60 constitutes a first X-ray detection unit. The point sensor 60 is selected, for example, from one that has a proven track record of stability and is capable of measuring long-term dose fluctuations with high reliability. The point sensor 60 is capable of constantly detecting the X-ray dose over the entire Y direction at any Z position within the electron beam-reaching range RA, thus making it possible to detect the relative total X-ray dose constantly.

Figure 4:
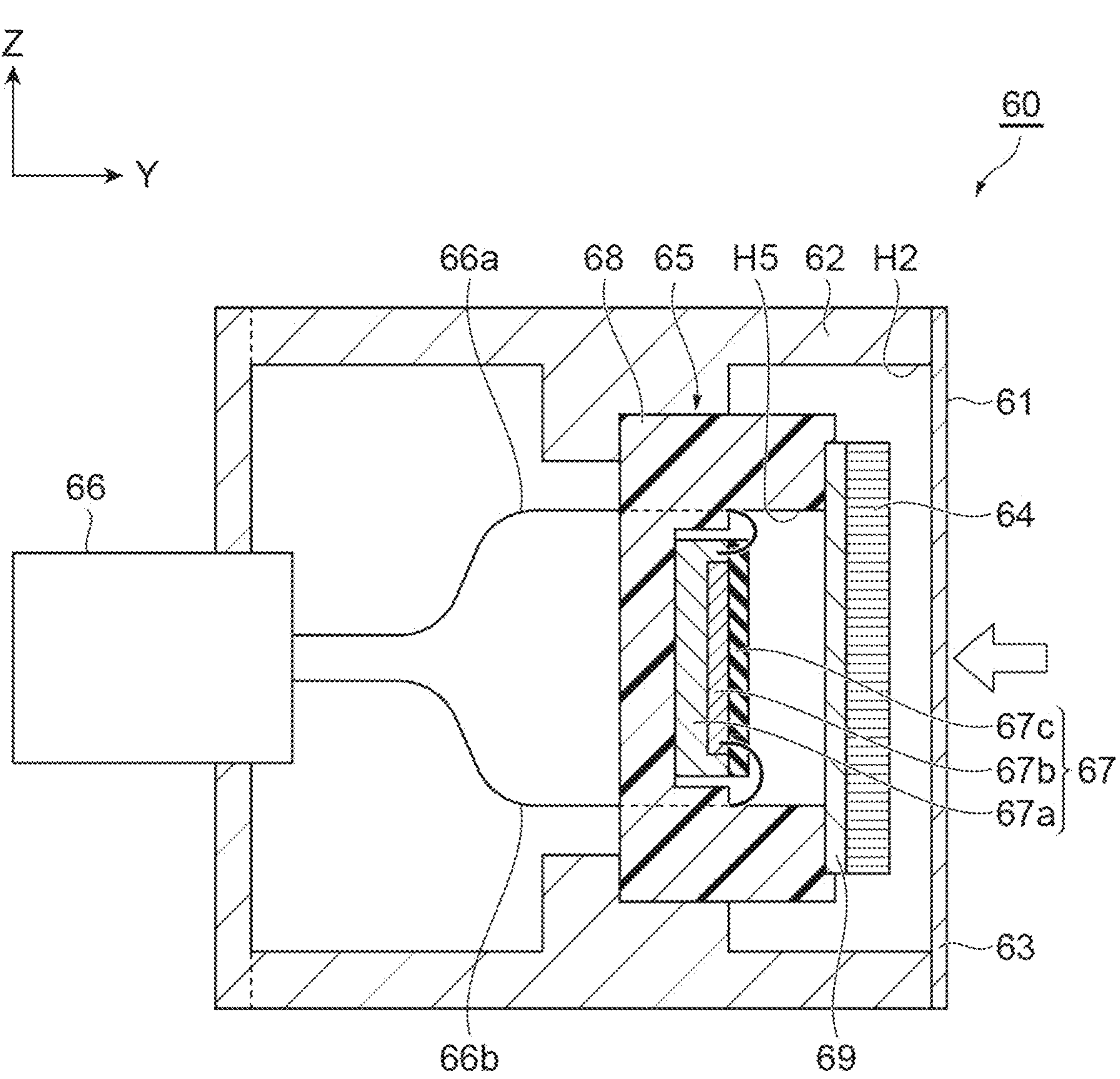
FIG. 4 is a schematic cross-sectional view illustrating an example of a point sensor of FIG. 3.

FIG. 4 is a schematic cross-sectional view illustrating an example of the point sensor 60. The point sensor 60 mainly includes a bottomed case 62 of a substantially rectangular parallelepiped shape having an opening H2, a flat plate-shaped lid 63 having X-ray transparency that blocks the opening H2, a phosphor layer 64, a photodiode 65, and a connector 66 fixed to the bottomed case 62 and electrically connected to the photodiode 65. The phosphor layer 64 and the photodiode 65 are housed in the bottomed case 62. The surface of the flat plate-shaped lid 63 constitutes the detection surface 61.

The phosphor layer 64 converts X-rays that enter the inside of the bottomed case 62 from outside the bottomed case 62 through the flat plate-shaped lid 63 into fluorescence of a wavelength detectable by the photodiode 65. The phosphor layer 64 is a layer composed of deposited crystalline X-ray phosphors. The fluorescence wavelength-converted from X-rays by the phosphor layer 64 is applied to a photoelectric conversion unit 67 in the photodiode 65. The X-ray phosphor constituting the phosphor layer 64 is not limited to a particular one as long as it can convert X-rays into fluorescence with a wavelength detectable by the photodiode 65, and it is selected as appropriate depending on the photoelectric conversion unit 67 to be used. In one example, as the X-ray phosphor constituting the phosphor layer 64, a $Gd_2O_2S$ phosphor doped with Tb can be used, which has the advantage of substantially no deterioration due to incident X-rays and low dependence of the amount of light emission on temperature (approximately −1.0% per 10° C.; this value indicates the variation rate in the amount of light emission upon fluctuations in temperature, with the amount of light emission at 20° C. taken as the reference). Moreover, Tb is an activator necessary for causing $Gd_2O_2S$ to function as an X-ray phosphor. The phosphor layer 64 may be composed of an X-ray phosphor using a material with minimal discoloration (browning) due to radiation.

The photodiode 65 photoelectrically converts the fluorescence emitted from the phosphor layer 64 into an electric signal for output. The photodiode 65 includes a bottomed case 68 of a substantially rectangular parallelepiped shape having an opening H5, a flat plate-shaped lid 69 that blocks the opening H5, and the photoelectric conversion unit 67 housed in the bottomed case 68.

The bottomed case 68 has an internal space in which the photoelectric conversion unit 67 can be accommodated and fixed. The constituent material of the bottomed case 68 is not limited to a particular one as long as it is insulating material but includes materials with excellent heat resistance and mechanical strength (e.g., ceramic materials). The flat plate-shaped lid 69 is a flat plate made of quartz glass with minimal discoloration due to radiation. The photoelectric conversion unit 67 has the structure of a PN photodiode (e.g., a Si photodiode) having a p-n junction. In other words, the photoelectric conversion unit 67 includes an n-type semiconductor layer 67*a* placed on the bottom surface of the bottomed case 68, a p-type semiconductor layer 67*b* placed on the n-type semiconductor layer 67*a*, an insulating film 67*c* placed on the p-type semiconductor layer 67*b*, an electrode electrically connected to the n-type semiconductor layer 67*a* (not illustrated), and an electrode electrically connected to the p-type semiconductor layer 67*b* (not illustrated). The surface on the incident side of the insulating film 67*c* becomes the light-receiving surface of the photoelectric conversion unit 67. The insulating film 67*c* is, for example, a silicon nitride film (SiN film). The point sensor 60 may be applied with ozone corrosion prevention measures, such as covering the surface of the wiring for transmitting signals from the bottomed case 62 and the point sensor 60 with a corrosion-resistant metal (e.g., stainless steel).

The connector 66 is fitted and fixed to the bottom of the bottomed case 62. The connector 66 is electrically connected to one end of each of conductive wires 66*a* and 66*b*. The conductive wire 66*a* has the other end electrically connected to the electrode connected to the n-type semiconductor layer 67*a* of the photodiode 65 (not illustrated). The conductive wire 66*b* has the other end electrically connected to the electrode connected to the p-type semiconductor layer 67*b* of the photodiode 65 (not illustrated). The connector 66 causes the electrical signal output from the photoelectric conversion unit 67 of the photodiode 65 to output to the outside of the bottomed case 62.

As illustrated in FIGS. 1 and 3, the line sensor 70 is an X-ray detector that detects a one-dimensional distribution or a two-dimensional distribution of X-rays (a second X-ray detector). The line sensor 70 has a detection surface 71 with an elongated shape in the Y direction. The width in the Y direction in the detection range of the line sensor 70 may be, for example, 300 mm to 2000 mm, or alternatively, 450 mm to 1000 mm. The line sensor 70 is arranged in a position that does not interfere with the irradiation of the irradiation target object S with the electron beam EB. In the present embodiment, the line sensor 70 is placed outside the electron beam-reaching range RA. The line sensor 70 is arranged in such a way that the detection surface 71 faces the emission window 55. The line sensor 70 is arranged on the side opposite to the emission window 55 with respect to the conveyance surface 82 of the conveyance mechanism 8. The line sensor 70 is fixed to the frame or the like of the electron beam irradiation system 100, for example, by a support member (not illustrated).

The line sensor 70 has multiple channels for detecting X-rays, and these channels are arranged in a one-dimensional or two-dimensional configuration. More specifically, it has multiple detection elements, each having one detection signal output unit corresponding to one detection surface. The multiple detection elements of the line sensor 70 are arranged in a one-dimensional or two-dimensional configuration, in other words, they are sensors having a plurality of pixels. In one example, as the line sensor 70, it is possible to use a one-dimensional line sensor in which several hundred or more X-ray phosphors and semiconductor photodetectors having a sensitivity capable of detecting the fluorescence from the X-ray phosphors are arranged in a length of several hundred millimeters (e.g. a photodiode array). The line sensor 70 acquires detection data regarding the X-ray dose over time in each of multiple channels corresponding to multiple detection elements. The line sensor 70 is connected to the controller 9 and its operations are controlled by the controller 9. The line sensor 70 outputs its detection result to the controller 9. The line sensor 70 constitutes a second X-ray detection unit.

The line sensor 70 is capable of measuring, for example, the position distribution of X-rays with high spatial resolution (several mm or less). The line sensor 70 is capable of instantaneously acquiring an X-ray dose profile in the longitudinal direction (Y direction). The line sensor 70 is capable of constantly detecting whether there are fluctuations in the X-ray distribution in the Y direction. The line sensor 70 is capable of accurately monitoring relative fluctuations in the X-ray distribution.

The collimator 75 is arranged between the emission window 55 and the line sensor 70. The collimator 75 restricts the direction of the X-ray so that it travels along the Z direction (direction facing the emission window 55) and restricts the angular field of view of the X-rays passing through the collimator 75. In the illustrated example, the collimator 75 is arranged between the electron beam-reaching range RA and the line sensor 70. The collimator 75 parallelizes the traveling direction of the X-ray incident on the line sensor 70 in the direction along the Z direction (see the arrow in FIG. 3). The collimator 75 is made of a material with high X-ray absorption characteristics (e.g., such as tungsten, lead, and stainless steel). The collimator 75 has a plurality of circular through holes **75*h* that traverse in the Z direction. The pitch of the multiple through holes 75*h* is larger than the pitch of the multiple channels in the line sensor 70. For example, the pitch of the through holes 75*h* is 10 mm, while the pitch of the channels of the line sensor 70 is 0.4 mm. The collimator 75 is fixed to the frame or the like of the electron beam irradiation system 100 or the line sensor 70**, for example, by a support member (not illustrated).

As illustrated in FIG. 1, the controller 9 includes a correction unit 91 that corrects a result obtained from the detection by the line sensor 70 on the basis of a result obtained from the detection by the point sensor 60. The correction unit 91 calculates the variation rate of the detection data acquired by the point sensor 60 as a first variation rate. The correction unit 91 calculates the variation rate of the total sum of the detection data of the respective multiple channels acquired by the line sensor 70 as a second variation rate. The correction unit 91 multiplies each of the detection data acquired by the multiple channels in the line sensor 70 by a correction coefficient so that the second variation rate matches the first variation rate. The processing performed by the correction unit 91 will be described later.

The controller 9 monitors the dose and distribution of the electron beam EB applied to the irradiation target object S on the basis of the result obtained by monitoring X-rays in the point sensor 60 and the line sensor 70. An approach to determine the dose of the electron beam EB from the measured amount of the X-ray is not limited to a particular one, and various known approaches can be used. The controller 9 is connected to a graphical user interface (GUI) 92. The GUI 92 constitutes a display unit used to display the monitoring results of the X-ray and the electron beam EB and also constitutes an operation input unit used to enter various settings to the controller 9.

Figure 6:
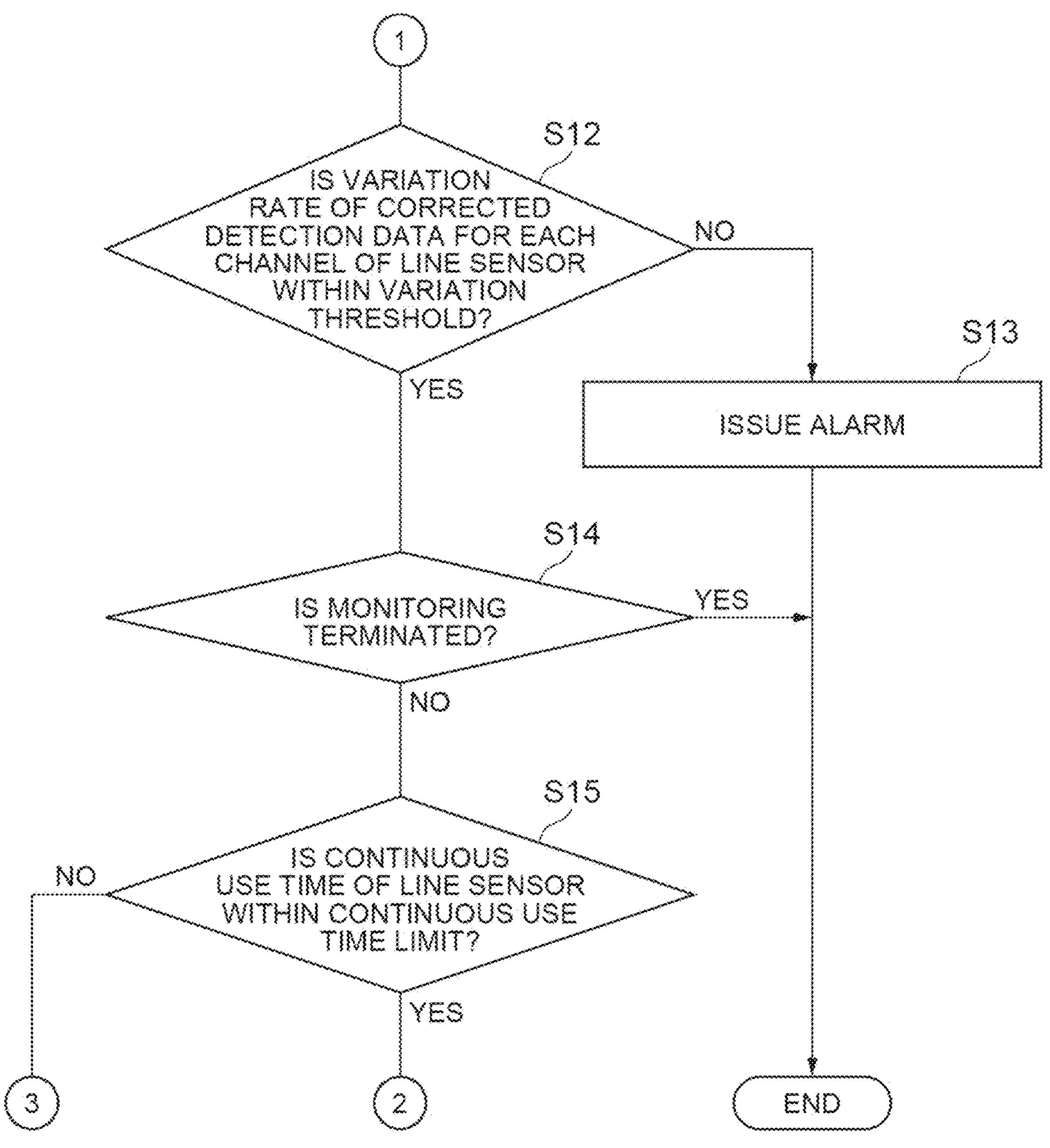
FIG. 6 is another flowchart illustrating an example of the electron beam monitoring method using the electron beam monitoring device of FIG. 3.

An example of an electron beam monitoring method using the electron beam monitoring device 10 is now specifically described with reference to the flowcharts of FIGS. 5 and 6.

In the GUI 92, a continuous use time limit for the line sensor 70 is first set (step S1). The continuous use time limit for the line sensor 70 corresponds to a period during which the difference in deterioration (decrease difference in detection capability) between the multiple channels is less than a predetermined value upon continuous use of the line sensor 70. The continuous use time limit for the line sensor 70 may be determined in advance and stored in the controller 9. Additionally, in the GUI 92, a variation rate threshold for the line sensor 70 is set (step S2). The variation rate threshold for the line sensor 70 is a threshold value for determining whether the variation rate of the detection data of the line sensor 70 is within a required criterion. The variation rate threshold of the line sensor 70 may be determined in advance and stored in the controller 9. Moreover, steps S1 and S2 described above are performed in optional order.

Subsequently, in the case where the electron beam irradiation device 1 irradiates the irradiation target object S with the electron beam EB, the controller 9 executes the following monitoring processing. In other words, the line sensor 70 is initialized (step S3). In step S3, all channels of the line sensor 70 are normalized (shading correction). In one example, in the first initialization in step S3, the detection data for all channels of the line sensor 70 when irradiated with the electron beam EB is corrected to a constant value. Additionally, for example, in the second and subsequent initializations in step S3, the detection data for all channels of the line sensor 70 is corrected to the corrected detection data (described later) at that time. The detection data at that time is acquired as an initial value for all channels of the line sensor 70 (step S4). In addition, in the point sensor 60, the detection data at that time is acquired as an initial value (step S5).

Subsequently, detection data is acquired for all channels of the line sensor 70 (step S6). The second variation rate, which is a variation rate of the total sum of detection data for each channel of the line sensor 70, is calculated (step S7). The second variation rate is a variation rate based on the total sum of initial values for each channel of the line sensor 70. For example, the second variation rate is calculated as follows: "(total sum of detection data for each channel of the line sensor 70−total sum of initial values for each channel of the line sensor 70)/total sum of initial values for each channel of the line sensor 70".

Further, the detection data of the point sensor 60 is acquired (step S8). The first variation rate, which is a variation rate of the detection data of the point sensor 60, is calculated (step S9). The first variation rate is a variation rate based on the initial value of the point sensor 60. For example, the first variation rate is calculated as follows: "(detection data of point sensor 60−initial value of point sensor 60)/initial value of point sensor 60".

The correction unit 91 calculates a correction coefficient for the line sensor 70 (step S10). The correction coefficient is a parameter used to correct the detection data for the multiple channels in the line sensor 70 so that the second variation rate matches the first variation rate. For example, the correction coefficient may be obtained as the first variation rate divided by the second variation rate. The correction unit 91 corrects the detection data for each channel of the line sensor 70 using the calculated correction coefficient (step S11). In step S11, the correction coefficient is multiplied by the detection data for each channel in the line sensor 70, obtaining multiple corrected detection data.

Subsequently, the variation rate of the corrected detection data for each channel of the line sensor 70 is calculated. The variation rate of the corrected detection data is calculated with reference to the initial value for each channel of the line sensor 70. It is determined whether the variation rate of the corrected detection data for each channel of the line sensor 70 is within a variation threshold being set (step S12).

In step S12, for example, in the case of NO, an alarm through a sound and display is issued from the GUI 92, and the monitoring processing is terminated (step S13). In the case of YES in step S12, for example, the dose and distribution of the X-rays monitored by the point sensor 60 and the line sensor 70, as well as the dose and distribution of the electron beam EB derived from the dose and distribution of the X-rays are displayed on the GUI 92. Additionally, in the case of YES in step S12, it is determined whether or not to terminate the monitoring processing (step S14). In step S14, for example, if irradiation with the electron beam EB from the electron beam irradiation device 1 is completed, it is determined as YES, and the monitoring processing is terminated.

In the case of NO in step S14, it is determined whether the continuous use time of the line sensor 70 is within the continuous use time limit (step S15). The continuous use time of the line sensor 70 is the duration during which the line sensor 70 continuously detects the distribution of X-rays and is counted from the timing of initializing the line sensor 70 and starting at zero. In the case of YES in step S15, the processing proceeds to step S6, where the line sensor 70 acquires detection data again, and the processing proceeds to step S8, where the point sensor 60 acquires detection data again. In the case of NO in step S15, the processing moves to step S3, and the line sensor 70 is initialized again.

As described above, the electron beam monitoring device 10 includes the point sensor 60 and the line sensor 70. The point sensor 60 is capable of acquiring the total X-ray dose, and the line sensor 70 is capable of acquiring relative fluctuations in the X-ray distribution. In other words, the point sensor 60 is capable of monitoring the overall dose of X-rays generated by the electron beam EB applied to the irradiation target object S. The line sensor 70 is capable of monitoring the one-dimensional distribution or two-dimensional distribution of X-rays generated by the electron beam EB applied to the irradiation target object S. This makes it possible to monitor the dose and distribution of the electron beam EB applied to the irradiation target object S. As a result, it is possible to confirm whether the electron beam EB is being output with the dose and distribution at the predetermined criteria for dose and distribution. In other words, it is possible to check whether there is any region where the electron beam EB that deviates from the predetermined criteria is being output. This ensures the operational status of the electron beam irradiation device 1.

In the electron beam monitoring device 10, the emission window 55 has an elongated shape, and the point sensor 60 is arranged in a position spaced apart from the emission window 55 in the longitudinal direction (Y direction) of the emission window 55. This arrangement of the point sensor 60 is effective in monitoring the overall dose of generated X-rays with the point sensor 60 in the case where the emission window 55 has an elongated shape. In one example, compared to the case where the point sensor 60 is positioned at a distance from the emission window 55 in the transverse direction (X direction), it is possible to detect the overall dose of generated X-rays with higher accuracy.

In the electron beam monitoring device 10, the point sensor 60 has only one channel. In this case, using the point sensor 60 with a single channel for detecting X-rays as the first X-ray detection unit allows for easy monitoring of the overall dose of generated X-rays without the need for complicated signal processing.

In the electron beam monitoring device 10, the line sensor 70 may have an elongated-shaped detection surface. In this case, it becomes possible to monitor the distribution of X-rays in the longitudinal direction of the emission window 55 by using the line sensor 70 having an elongated detection surface.

In the electron beam monitoring device 10, the line sensor 70 has multiple channels arranged in a one-dimensional or two-dimensional form. In this case, it becomes possible to monitor the distribution of X-rays in more detail by using the line sensor 70 having a plurality of channels arranged one-dimensionally or two-dimensionally as the second X-ray detection unit.

The electron beam monitoring device 10 is equipped with the collimator 75 placed between the emission window 55 and the line sensor 70. The collimator 75 allows aligning the traveling direction of the X-ray incident (input) to the line sensor 70 in the Z direction. As a result, it is possible for the line sensor 70 to accurately detect the one-dimensional or two-dimensional distribution of X-rays generated by the electron beam (EB) applied to the irradiation target object S (i.e., the one-dimensional or two-dimensional distribution corresponding to the quantity of the electron beam EB). Generally, the X-ray is applied to the line sensor 70 in all directions from the entire electron beam-reaching range RA, so the installation of the collimator 75 is particularly effective.

In the electron beam monitoring device 10, the point sensor 60 and the line sensor 70 are placed in a position that does not interfere with the irradiation of the irradiation target object S with the electron beam EB. More specifically, the point sensor 60 and the line sensor 70 are positioned outside the electron beam-reaching range RA. In this case, it is possible to place the point sensor 60 and the line sensor 70 at a position that does not interfere with the irradiation of the irradiation target object S with the electron beam EB. Additionally, there is no disturbance to measurements caused by the generation of X-rays from the point sensor 60 and the line sensor 70 themselves due to the interaction between the electron beam EB and the materials forming the point sensor 60 and the line sensor 70.

The electron beam monitoring device 10 is provided with the correction unit 91 that corrects the detection result of the line sensor 70 on the basis of the detection result of the point sensor 60. The correction unit 91 is capable of correcting the detection result of the line sensor 70 based on the detection result of the point sensor 60, mitigating the adverse effect due to the sensitivity fluctuation of the line sensor 70. This allows for accurate detection of the one-dimensional distribution or two-dimensional distribution of the X-ray and precise monitoring of the distribution of the electron beam EB applied to the irradiation target object S. By leveraging the respective strengths of the point sensor 60 and the line sensor 70 and utilizing their performance complementarily, it becomes possible to optimize the monitoring of electron beam dose by X-rays.

In the line sensor 70, there may be instances where reliability regarding long-term stability is lacking compared to the point sensor 60. The line sensor 70 may exhibit a faster sensor response deterioration rate compared to the point sensor 60. In the line sensor 70, for example, there is a possibility that the dose of X-rays detected may decrease by 25% after 1000 hours of use. Thus, in the electron beam monitoring device 10, the correction unit 91 calculates the variation rate of the detection data obtained by the point sensor 60 as the first variation rate, and calculates the variation rate of the total sum of the detection data obtained by the line sensor 70 as the second variation rate. The correction unit 91 multiplies the correction coefficient to the detection data obtained by multiple channels in the line sensor 70 so that the second variation rate matches the first variation rate. This enables the detection results of the line sensor 70 to be effectively corrected using the detection results of the point sensor 60.

In the electron beam monitoring device 10, the point sensor 60 is arranged in a position spaced apart from the conveyance surface 82 in the Y direction that intersects with the transport direction of the conveyance mechanism 8. The line sensor 70 is positioned opposite to the emission window 55 relative to the conveyance surface 82. In this case, the point sensor 60 and the line sensor 70 are applicable to a position that is not affected by transportation in the electron beam irradiation system 100 including the conveyance mechanism 8.

In the electron beam irradiation system 100 as well, by incorporating the electron beam monitoring device 10, the same benefits mentioned above, such as monitoring the dose and distribution of the electron beam (EB) applied to the irradiation target object S, are achieved.

FIG. 7 is a table illustrating an example of correction of the detection data of the line sensor 70 based on the detection data of the point sensor 60. The cycle time in FIG. 7 corresponds to the predetermined time interval, for example, corresponding to the interval during which steps S6 and S8 are repeated in the flowchart of FIGS. 5 and 6. In the figure, the 5-cycle time represents the continuous use time limit. In the figure, CH1, CH2, and CH3 represent the first channel, the second channel, and the third channel among the multiple channels of the line sensor 70.

In the example illustrated in FIG. 7, the first initialization with the line sensor 70 is performed when the cycle time is 0, and the second and subsequent initializations with the line sensor 70 are performed when the cycle time is 5 or 10. In the second and subsequent initializations, the corrected detection data at that time is directly employed for shading correction (as indicated by the box reference in the figure). In the example illustrated in FIG. 7, using the correction coefficient based on the detection data of the point sensor 60 and the line sensor 70 and correcting the detection data of the line sensor 70 make it possible to obtain the corrected detection data.

The above has described embodiments, but one aspect of the present disclosure is not limited to the embodiment described above.

Figure 8:
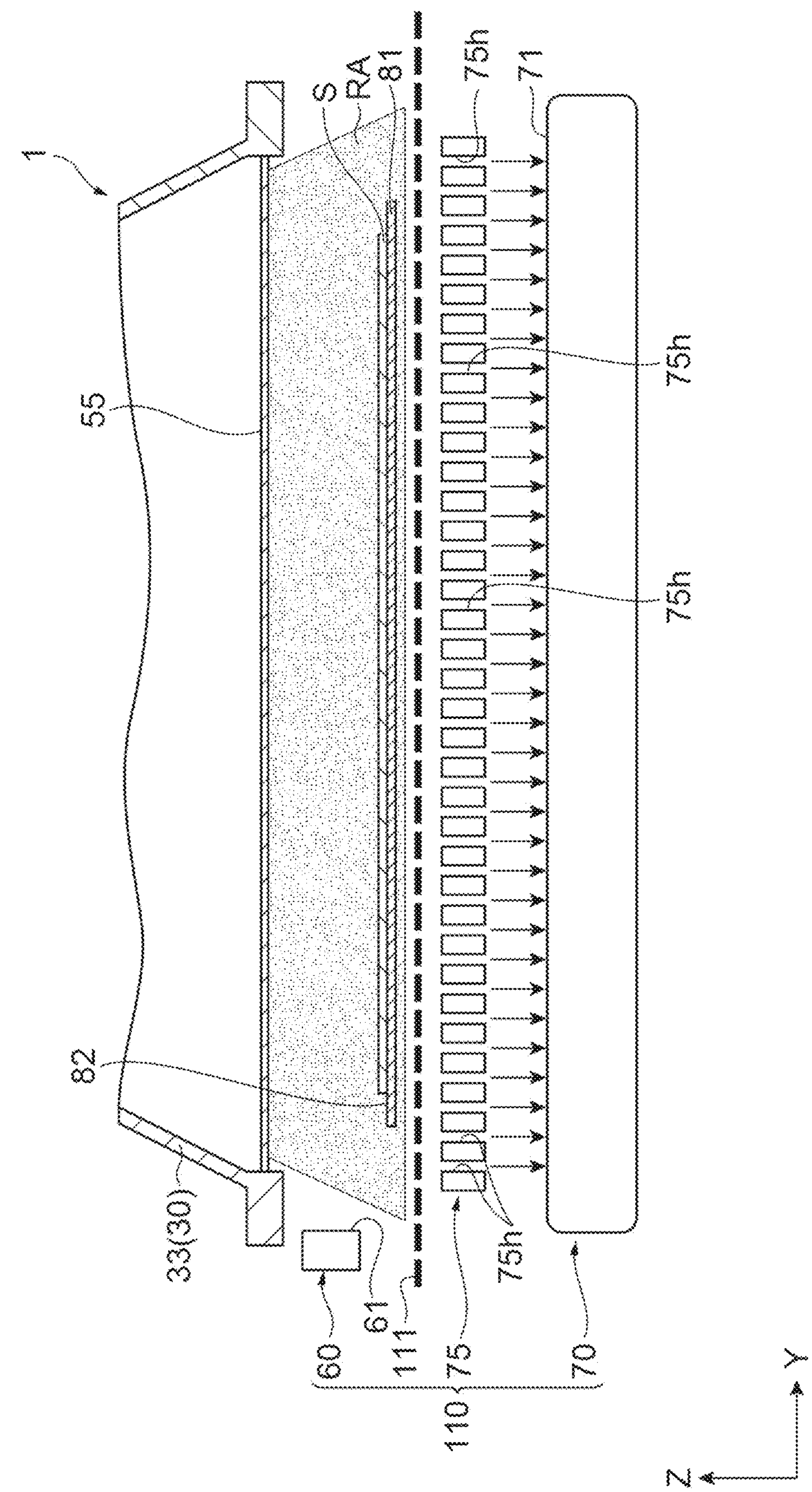
FIG. 8 is a schematic diagram illustrating an electron beam monitoring device according to a modification.

FIG. 8 is a schematic diagram illustrating an electron beam monitoring device 110 according to a modification. As illustrated in FIG. 8, the electron beam monitoring device 110 according to the modification differs from the electron beam monitoring device 10 (see FIG. 3) in that it further includes a shutter mechanism (blocking unit) 111. The shutter mechanism 111, which includes a mechanism capable of blocking X-rays from entering the line sensor 70, allows X-rays to enter the line sensor 70 by being in an open state and blocks X-rays from entering the line sensor 70 by being in a closed state. The shutter mechanism 111 is connected to the controller 9, and its opening and closing operations are controlled by the controller. The shutter mechanism 111 is not limited to a particular one and various mechanisms can be used.

The electron beam monitoring device 110 described above is capable of blocking X-rays so that X-rays are not entered in the line sensor 70 except upon the detection of X-rays. This makes it possible to suppress fluctuations in the sensitivity of the line sensor 70 as the X-ray irradiation time to the line sensor 70 increases. Moreover, the device may include a moving mechanism such as a stage to move the line sensor 70. In one example, the line sensor 70 may be moved by a moving mechanism so that no X-rays are entered into the line sensor 70 except upon detecting X-rays.

In the electron beam irradiation device 1 according to embodiment and modification described above, the elongated-shaped electron beam-reaching range RA is obtained by deflecting the dotted electron beam EB with the deflection coil 5. However, there may be used an electron beam irradiation device that extracts linear electron beams, which are emitted from an elongated-shaped filament, from an elongated-shaped emission window without deflecting the electron beam. Additionally, it may be possible to form an elongated-shaped electron beam-reaching range by arranging multiple electron beam irradiation devices. Furthermore, by providing an energy discrimination function to at least one of the point sensor 60 and the line sensor 70, X-rays may be detected with specific element dependence (e.g., detection of characteristic X-rays of titanium, the material of the emission window 55). In the embodiment and modification described above, the point sensor 60 is used as the first X-ray detection unit, and the line sensor 70 is used as the second X-ray detection unit, but this configuration is not limited to the described examples, and other X-ray detectors may be used. In one example, the line sensor 70 may be used as the first X-ray detection unit, and in this case, the outputs of the multiple channels may be combined and output as one. As the second X-ray detection unit, an area sensor that detects the two-dimensional distribution of X-rays may be used.

In the embodiment and modification described above, the combination of X-ray phosphors and semiconductor photodetectors is used for both the point sensor 60 and the line sensor 70. However, a combination of X-ray phosphors and electron tubes such as photomultiplier tubes may also be used, or direct conversion type semiconductor devices that directly detect X-rays without using X-ray phosphors may be used. As the second X-ray detection unit, an area sensor that detects the two-dimensional distribution of X-rays may be used. In the embodiment described above, the variation rate of the total sum of detection data for each channel of the line sensor 70 is calculated as the second variation rate, but an average of the detection data variation rates for each channel of the line sensor 70 may also be calculated as the second variation rate.

In the embodiment and modification described above, the first X-ray detection unit may include a plurality of first X-ray detectors, each having only one channel for detecting X-rays. Furthermore, among the multiple first X-ray detectors, a pair of the first X-ray detectors may be arranged to face each other across the electron beam-reaching range RA. Additionally, the second X-ray detection unit may include the multiple second X-ray detectors, each having only one channel for detecting X-rays, and the second X-ray detectors may be arranged in a one-dimensional or two-dimensional form. In one example, an electron beam monitoring device 220 according to another modification described below may be employed.

Figure 9:
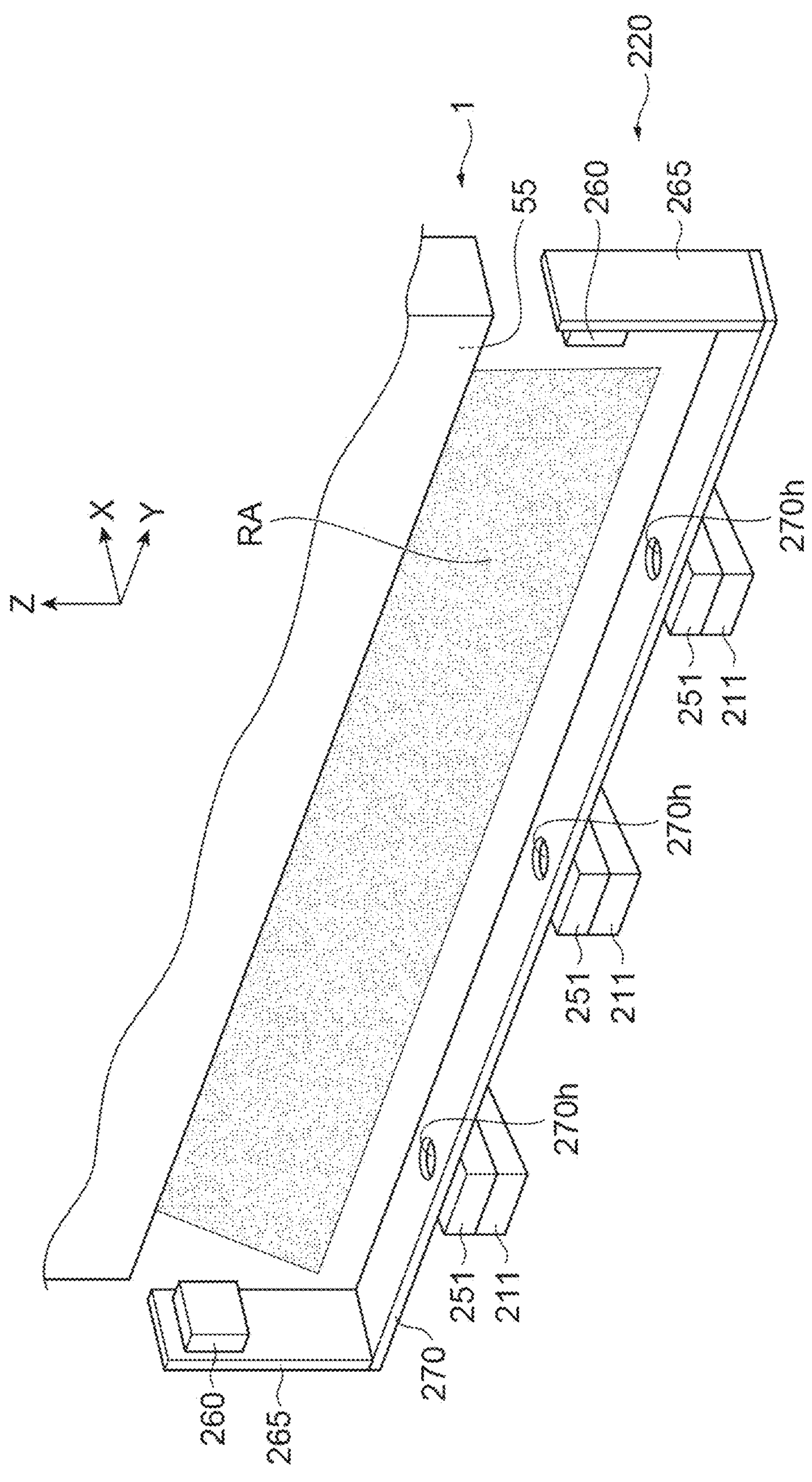
FIG. 9 is a schematic perspective view illustrating an electron beam monitoring device according to another modification.
Figure 10:
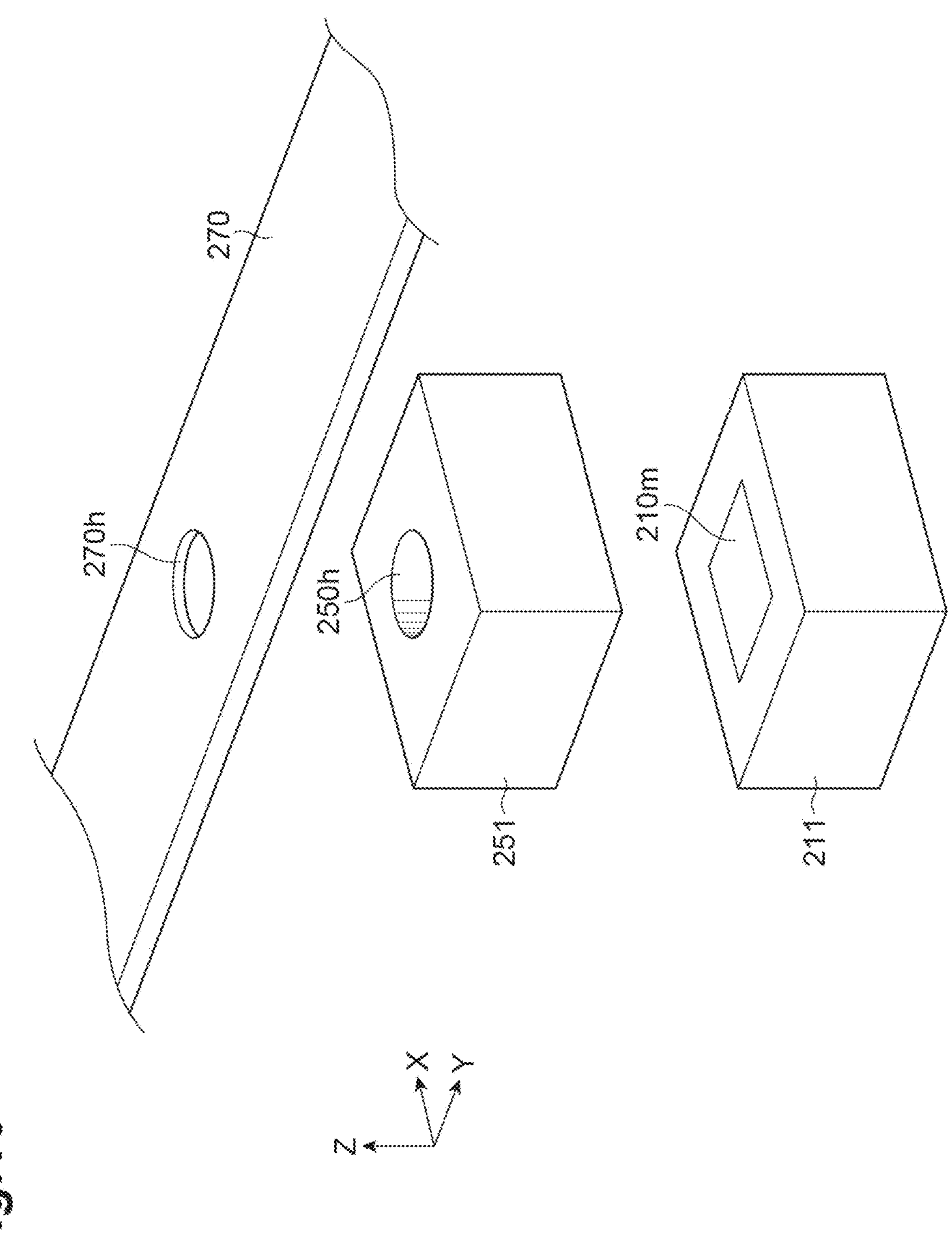
FIG. 10 is a schematic perspective view illustrating a point sensor as a second X-ray detector of FIG. 9.

FIG. 9 is a schematic perspective view illustrating the electron beam monitoring device 220. FIG. 10 is a schematic perspective view illustrating a point sensor 211 as the second X-ray detector in FIG. 9. As illustrated in FIG. 9, the electron beam monitoring device 220 includes a pair of point sensors 260, similar to the point sensor 60 described above, as the first X-ray detector. Each of the point sensors 260 has only one channel for detecting X-rays. The pair of point sensors 260 are arranged at a distance from each other in the Y direction, with their detection surfaces facing each other across the electron beam-reaching range RA in the Y direction. The pair of point sensors 260 are located in the Y direction to sandwich the emission window 55. Each of the point sensors 260 is fixed and supported on a support plate 265. The support plate 265 is fixed to the frame or the like of the electron beam irradiation system 100.

In the case where the RA of the electron beam-reaching range RA has an elongated shape, the amount of X-rays (i.e., the amount of the electron beam EB) incident on the first X-ray detector installed at one location on one side of the longitudinal direction is likely to vary significantly depending on whether the X-rays are generated near or far from the first X-ray detector. Even if there is a partial fluctuation in the dose of the same electron beam EB, the effect on the measured value differs depending on whether the fluctuations in X-rays due to the partial fluctuation occurs near or far from the first X-ray detector. Thus, with the first X-ray detector installed at one location on one side, there is a risk that it may not accurately reflect the "fluctuation of the total amount" in the event of local dose fluctuations, which is its role. In this regard, in the electron beam monitoring device 220, a pair (multiple) of the point sensors 260 are provided. Furthermore, the pair of point sensors 260 are arranged to face each other across the electron beam-reaching range RA. In this case, using the multiple point sensors 260 makes it possible to monitor the overall dose of generated X-rays more accurately. By opposing two of the point sensors 260 coaxially, the sum or average of the measurements of the two of the point sensors 260 can be employed as the signal of the first X-ray detection unit (i.e., fluctuations in total electron beam output), making it possible to correct for the influence due to the location of X-ray generation.

As illustrated in FIG. 9 and FIG. 10, the electron beam monitoring device 220 is provided with multiple point sensors 211, similar to the point sensor 60 described above, as the second X-ray detector, instead of the line sensor 70 described above (refer to FIG. 3). Each of the multiple point sensors 211 has only one channel for detecting X-rays. The multiple point sensors 211 are arranged so that their detection surfaces 210*m* face the emission window 55. The multiple point sensors 211 are aligned in a one-dimensional form in the Y direction at predetermined intervals. Each of the multiple point sensors 211 is fixed to a fixing plate 270 via a collimator 251.

The collimator 251 is positioned between the emission window 55 and the point sensor 211. The collimator 251 restricts the direction of traveling of X-rays in the Z direction, limits the field of view of the passing X-rays, and parallelizes the direction of traveling of X-rays incident on the point sensor 211 along the Z-direction. The collimator 251 has a circular through hole 250*h* penetrating in the Z direction. The through hole 250*h* is provided to overlap with the detection surface 210*m* of the point sensor 211 when viewed from the Z direction. The fixing plate 270 is fixed to the frame or the like of the electron beam irradiation system 100. A circular through hole 270*h* penetrating in the Z direction is provided in the fixing plate 270 to communicate with the through hole 250*h* of the collimator 251.

In this way, the electron beam monitoring device 220 is provided with the multiple point sensors 211, each having only one channel for detecting X-rays, arranged in a one-dimensional form. In this case, it is possible to monitor the distribution of X-rays in more detail using the multiple point sensor 211 arranged in a one-dimensional form. The functions that are equivalent to the line sensor 70 described above (see FIG. 3) can be provided with the multiple point sensor 211 arranged in a one-dimensional form. Moreover, the point sensors 211 may be provided in multiple quantities, for example, about three to five sensors may be provided. The multiple point sensors 211 may also be arranged in a two-dimensional form along the X-Y plane.

Each component in the embodiment and modification described above is not limited to the materials and shapes described above, and various materials and shapes are applicable. Each component in the embodiment or modification described above is optionally applicable to other embodiments or modifications. Some components in the embodiment or modification described above may be omitted as appropriate without departing from the spirit of one aspect of the present disclosure.

REFERENCE SIGNS LIST

1 electron beam irradiation device
8 conveyance mechanism
10, 110, 220 electron beam monitoring device
55 emission window
60 point sensor (first X-ray detection unit, first X-ray detector)
61 detection surface
70 line sensor (second X-ray detection unit, second X-ray detector)
71 detection surface
75 collimator
82 conveyance surface
91 correction unit
100 electron beam irradiation system
111 shutter mechanism (blocking unit)
211 point sensor (second X-ray detector)
251 collimator
EB electron beam
RA electron beam-reaching range
S irradiation target object

The invention claimed is:

1. An electron beam monitoring device monitoring an electron beam in an electron beam irradiation system having an electron beam irradiation device configured to irradiate an irradiation target object with the electron beam via an emission window, the electron beam monitoring device comprising:

a first X-ray detection unit having a detection surface directed toward between the emission window and the irradiation target object and configured to detect an X-ray; and a second X-ray detection unit arranged to face the emission window and configured to detect a one-dimensional or two-dimensional distribution of the X-ray.

2. The electron beam monitoring device according to claim 1, wherein the emission window has an elongated shape, and the first X-ray detection unit is arranged in a position spaced apart from the emission window in a longitudinal direction of the emission window.

3. The electron beam monitoring device according to claim 1, wherein the first X-ray detection unit includes only one first X-ray detector having only one channel for detecting the X-ray.

4. The electron beam monitoring device according to claim 1, wherein the first X-ray detection unit includes a plurality of first X-ray detectors, each having only one channel for detecting the X-ray.

5. The electron beam monitoring device according to claim 4, wherein, among the multiple first X-ray detectors, a pair of the first X-ray detectors are arranged to face each other across an electron beam-reaching range, the range being a scope reached by the electron beam applied from the electron beam irradiation device.

6. The electron beam monitoring device according to claim 1, wherein the second X-ray detection unit has a detection surface with an elongated shape.

7. The electron beam monitoring device according to claim 1, wherein the second X-ray detection unit includes a second X-ray detector having multiple channels for detecting the X-ray, and the multiple channels are arranged in a one-dimensional or two-dimensional form.

8. The electron beam monitoring device according to claim 1, wherein the second X-ray detection unit includes a plurality of second X-ray detectors, each having only one channel for detecting the X-ray, and the multiple second X-ray detectors are arranged in a one-dimensional or two-dimensional form.

9. The electron beam monitoring device according to claim 1, further comprising: a collimator positioned between the emission window and the second X-ray detection unit and configured to restrict a traveling direction of the X-ray to align with a direction facing the emission window.

10. The electron beam monitoring device according to claim 1, further comprising: a blocking unit capable of blocking the X-ray incident on the second X-ray detection unit.

11. The electron beam monitoring device according to claim 1, wherein the first X-ray detection unit and the second X-ray detection unit are arranged in a position to avoid interference with irradiation of the irradiation target object with the electron beam.

12. The electron beam monitoring device according to claim 11, wherein the first X-ray detection unit and the second X-ray detection unit are arranged outside the electron beam-reaching range, the range being a scope reached by the electron beam applied from the electron beam irradiation device.

13. The electron beam monitoring device according to claim 1, further comprising: a correction unit configured to correct a result obtained from detection by the second X-ray detection unit based on a result obtained from detection by the first X-ray detection unit.

14. The electron beam monitoring device according to claim 13, wherein the first X-ray detection unit acquires detection data over time, the second X-ray detection unit acquires detection data for the multiple channels over time, and the correction unit, calculates a variation rate of the detection data acquired by the first X-ray detection unit as a first variation rate, calculates a variation rate of a total sum or an average of multiple pieces of the detection data acquired by the second X-ray detection unit as a second variation rate, and multiplies a correction coefficient to each of the detection data acquired in the multiple channels of the second X-ray detection unit in such a way as to make the second variation rate match the first variation rate.

15. The electron beam monitoring device according to claim 1, wherein the electron beam irradiation system includes a conveyance mechanism provided with a conveyance surface for transporting the irradiation target object, the first X-ray detection unit is arranged in a position spaced apart from the conveyance surface in a predetermined direction that is along the conveyance surface and intersects with a conveyance direction of the conveyance mechanism, and the second X-ray detection unit is arranged on a side opposite to the emission window with respect to the conveyance surface.

16. An electron beam irradiation system comprising: the electron beam monitoring device according to claim 1.

* * * * *